US007558158B2

(12) United States Patent

Wang et al.

(10) Patent No.: US 7,558,158 B2

(45) Date of Patent: Jul. 7, 2009

(54) ELECTRONIC APPARATUS AND METHOD FOR IMPLEMENTING AN INTELLIGENT WAKE MODE

(75) Inventors: Han-Che Wang, Guangdong (CN); Xiao-Guang Li, Guangdong (CN); Kuan-Hong Hsieh, Guangdong (CN); Wen-Chuan Lian, Guangdong (CN)

(73) Assignees: Hong Fu Jin Precision Industry (Shen Zhen) Co., Ltd., Longhua Town, Bao'an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 323 days.

(21) Appl. No.: 11/308,832

(22) Filed: May 12, 2006

(65) Prior Publication Data

US 2007/0025189 A1 Feb. 1, 2007

(30) Foreign Application Priority Data

Jul. 29, 2005 (CN) ........................ 2005 1 0036284

(51) Int. Cl.

*G04C 21/00* (2006.01)
*G04C 21/06* (2006.01)
*H03G 3/00* (2006.01)

(52) U.S. Cl. ........................... 368/245; 368/10; 368/73; 381/107

(58) Field of Classification Search ............. 368/72–75, 368/244–245, 250, 10; 381/107

See application file for complete search history.

(56) References Cited

U.S. PATENT DOCUMENTS

| | | | | |
|---|---|---|---|---|
| 3,873,921 | A * | 3/1975 | Petrinec | 455/231 |
| 4,343,043 | A * | 8/1982 | McLennan et al. | 455/231 |
| 4,377,345 | A * | 3/1983 | Yamada et al. | 368/245 |
| 4,386,856 | A * | 6/1983 | Hakata | 368/72 |
| 4,589,780 | A * | 5/1986 | Takebe | 368/245 |
| 5,243,568 | A * | 9/1993 | Burch et al. | 368/73 |
| 5,894,331 | A | 4/1999 | Yang | |
| 6,838,994 | B2 * | 1/2005 | Gutta et al. | 340/575 |

FOREIGN PATENT DOCUMENTS

JP H11-223689 8/1999

* cited by examiner

*Primary Examiner*—Vit W Miska
(74) *Attorney, Agent, or Firm*—Winston Hsu

(57) ABSTRACT

An electronic apparatus and method for implementing an intelligent wake mode is provided. The method includes the steps of: tracking a system time of the electronic apparatus; entering into the wake mode when the tracked system time is equal to a predetermined time; increasing a current volume for every predetermined time interval; and keeping the current volume when the current volume is equal to or greater than a predetermined initial volume.

3 Claims, 2 Drawing Sheets

ELECTRONIC APPARATUS AND METHOD FOR IMPLEMENTING AN INTELLIGENT WAKE MODE

TECHNICAL FIELD

The present invention relates generally to an electronic apparatus and method for implementing an intelligent wake mode.

GENERAL BACKGROUND

Listening to audio generation apparatuses helps many people relieve stress and tiredness. However, it is easy to fall asleep when listening to the audio generation apparatus. When a listener falls asleep while the audio generation apparatus is still on, electricity is wasted, and may also shorten the working lifetime of the audio generation apparatus. To prevent these problems, a listener can take advantage of the sleep mode sleep mode function provided on most audio generation apparatuses. There are numerous technologies implementing the sleep mode function of audio generation apparatuses, such as an invention. According to the invention, when a predetermined sleep mode time has passed, the audio generation apparatus is powered off. Additionally, a wake mode time is also preset, and the audio generation apparatus restores an initial volume when the predetermined wake mode time has passed.

However, this sudden change of noise level is not predictable and may cause shock to people, furthermore, the readiness to anticipate this sudden noise may also have an impact on the one's ear.

Thus, what is needed is an electronic apparatus and method that gradually increases playing parameters (such as volume, brightness) of the audio generation apparatus when the predetermined wake mode time has passed, in order to avoid influence on the user.

SUMMARY

An electronic apparatus for implementing an intelligent wake mode is provided. The electronic apparatus includes an input unit, a volume control unit, a timer, and a center control unit. The center control unit is connected with the input unit and the timer. The center control unit control the electronic apparatus to enter the wake mode when a tracked system time of the timer reaches a predetermined waken time, and controls the volume control unit to increase current volume when no operational input is received by the input unit for every predetermined time interval, and keeps the current volume when the current volume is equal to or greater than an initial volume.

A method for implementing an intelligent wake mode on an electronic apparatus is also provided. The method includes the steps of: (a) tracking a system time of the electronic apparatus; (b) entering into the wake mode when the tracked system time is equal to a predetermined time; (c) increasing a current volume for every predetermined time interval; and (d) keeping the current volume when the current volume is equal to or greater than a predetermined initial volume.

A method for implementing an intelligent wake mode on an electronic apparatus is further provided. The method includes the steps of: (a) starting the wake mode when a system time of the electronic apparatus equals to a predetermined waken time; (b) increasing an output parameter value for every predetermined time interval after the starting step; (c) repeating increasing step based on elapsed time and the playing parameter value; and (d) keeping a current output parameter after the output parameter reaches a predetermined value.

Other advantages and novel features will be drawn from the following detailed description of the embodiments with reference to the attached drawings, in which:

DETAILED DESCRIPTION OF THE PREFERRED EMBODIMENTS

Figure 1:
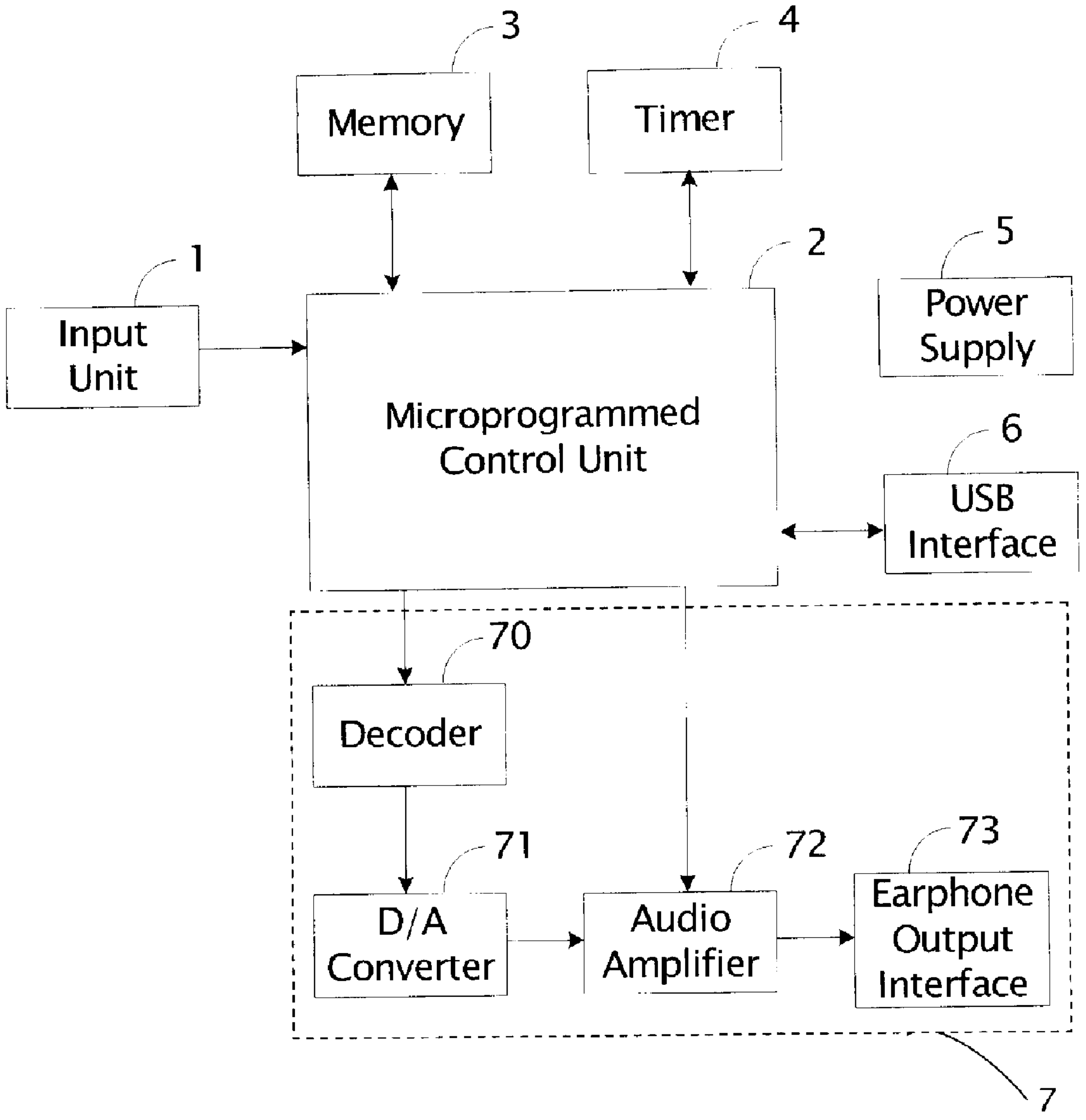
FIG. 1 is a block diagram of a hardware infrastructure of an electronic apparatus for implementing an intelligent wake mode in accordance with a preferred embodiment of the present invention.

FIG. 1 is a block diagram of a hardware infrastructure of an electronic apparatus for implementing an intelligent wake mode (hereinafter, "the electronic apparatus") in accordance with a preferred embodiment of the present invention. When a system time of the electronic apparatus reaches a waken time T0, the electronic apparatus automatically enters the wake mode, thereby gradually increases output parameters thereof. The output parameters may include a volume parameter and/or a brightness parameter. The waken time T0 may be a predetermined time variable. The electronic apparatus may be a television, a media player, an E-book, a satellite radio, and so on. For simplicity, in this embodiment, the electronic apparatus adopts a media player as an example, accordingly, the playing parameter may take example for the volume. In the preferred embodiment, the media player is turned off or is in a sleep mode before the media player enters the wake mode. While in sleep mode, a display unit (not shown) and a memory described below are not in use. Furthermore, the media player does not output volume.

The media player includes an input unit 1, a Microprogrammed Control Unit (MCU) 2, a memory 3, a timer 4, a power supply 5, and an audio outputting portion 7. The audio outputting portion 7 further includes a decoder 70, a Digital/Analog (D/A) converter 71, an audio amplifier 72, and an earphone output interface 73.

The media player further includes a Universal Serial Bus (USB) Interface 6 for connecting the MCU 2 to an external electronic apparatus (not shown) for downloading audio files therefrom into the memory 3. The audio files may be in a Moving Picture Experts Group (MPEG) audio layer 3 (MP3) format, an Advanced Audio Coding (MC) format, or any other suitable format. The memory 3 further stores information used or generated by the media player, such as predetermined parameters. The predetermined parameters include the waken time T0, a time interval A, and an initial volume. The value of waken time T0 may be a predetermined value stored in memory 3. The initial volume is a previously predetermined volume before the media player entered sleep mode or was turned off.

The input unit 1 receives an operational input, and generates an operation signal to the MCU 2. The timer 4 tracks a system time. The MCU 2 is provided for controlling audio signals outputs, and performing actions described below. The actions include: entering into the wake mode when the tracked system time reaches the waken time T0; increasing a volume of the media player if no operational input is received by the input unit 1 for every time interval A after the media player enters the wake mode; keeping a current volume when the current volume is equal to or greater than the initial volume and when no operational input is received by the input unit 1; restoring the initial volume when an operational input is received by the input unit 1 and when the operational input is not a power off operational input command after the media player enters the wake mode; and turning off the media player when an operational input is received by the input unit 1 and is the power off input command. In addition, with respect to the volume increment, it can be a certain percent of the initial volume of the media player or be a predetermined value.

The decoder 70 decodes audio files into digital audio signals. The D/A converter 71 converts the digital audio signals into analog audio signals. The MCU 2 further controls the audio amplifier 72 to increase or decrease intensities of the audio signals according to a signal for adjusting volume from the input unit 1. Accordingly, the audio amplifier 72 increases or decreases the volume under the control of the MCU 2, and outputs the audio signals increased or decreased amplifying intensity via the earphone output interface 73. The earphone output interface 73 is for accepting an earphone (not shown), and thus to output the analog audio signals.

Figure 2:
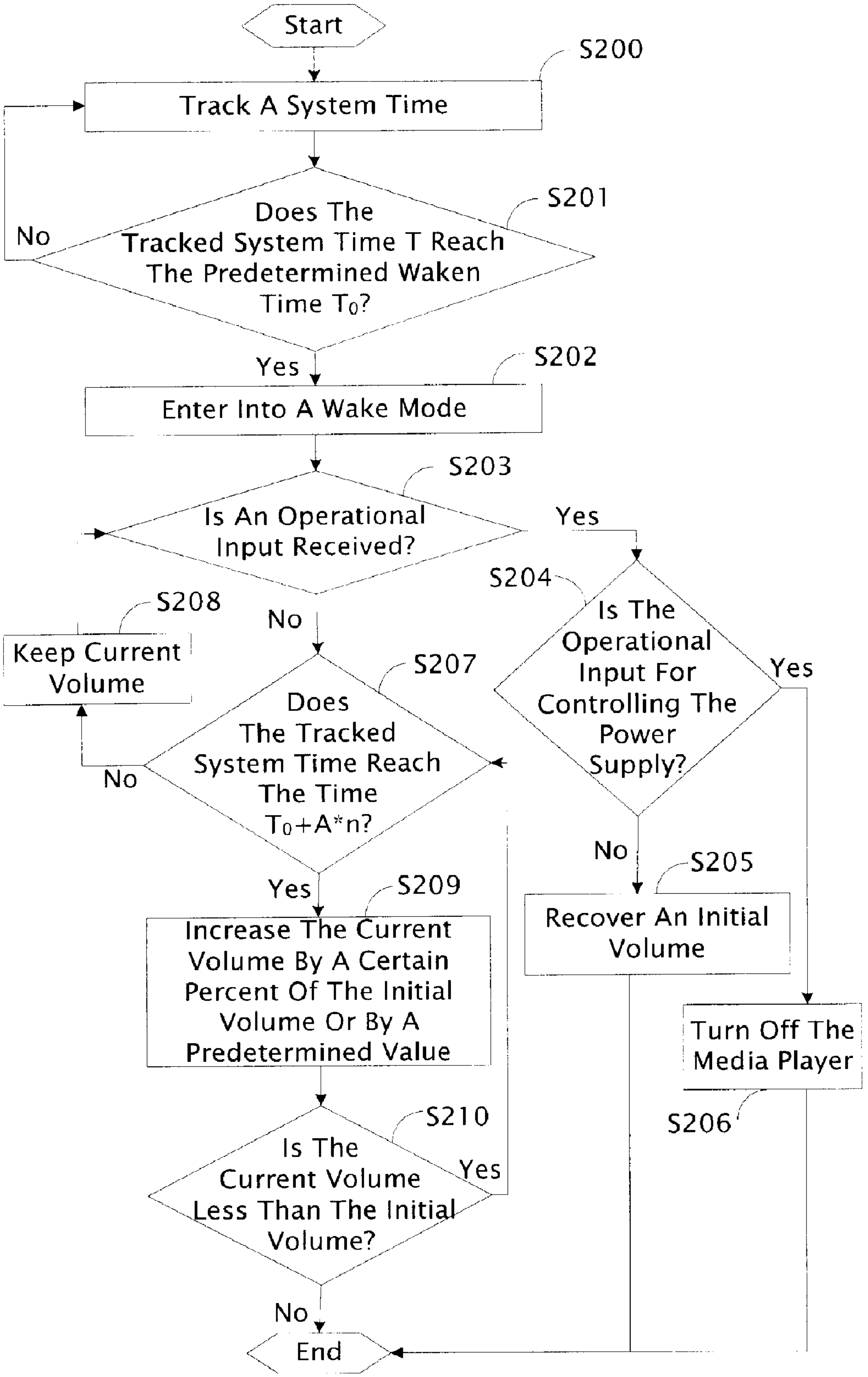
FIG. 2 is a flowchart of a preferred method for implementing an intelligent wake mode on the electronic apparatus of FIG. 1.

FIG. 2 is a flowchart of a preferred method for implementing an intelligent wake mode on the electronic apparatus of FIG. 1. The input unit 1 has received a signal of setting a waken time T0 from a user in advance. In step S200, the timer 5 tracks the system time in real time. In step S201, the MCU 2 determines whether the tracked system time reaches the predetermined waken time T0. If the tracked system time does not reach the predetermined waken time T0, the procedure returns to step S200 described above. If the tracked system time reaches the waken time T0, in step S202, the wake mode is started up, thereupon, the media player enters the wake mode. In step S203, the input unit 1 detects in real time whether it receives an operational input. If the operational input is received, in step S204, the input unit 1 generates an operational signal to the MCU 2, the MCU 2 determines whether the "received operational signal" is a signal for controlling the power supply 5. If the "received operational signal" is not the signal for controlling the power supply 5, in step S205, the audio amplifier 72 restores the initial volume. If the "received operational signal" is the signal for controlling the power supply 5, in step S206, the MCU 2 turns off the media player, whereupon the procedure ends.

If the input unit 1 does not receive an operational input, in step S207, the MCU 2 determines whether the tracked system time reaches a waken time T0+A*n (n being any natural number except 0.) If the tracked system time does not reach the waken time T0+A*n, in step S208, the media player keeps its current volume. If the tracked system time reaches the waken time T0+A*n, in step S209, the audio amplifier 72 increases the current volume by a certain percentage of the initial volume or by a predetermined value. In step S210, the MCU 2 determines whether the current volume is less than the predetermined initial volume. If the current volume is less than the predetermined initial volume, the procedure returns to step S207 described above. If the current volume is equal to or greater than the predetermined initial volume, the media player keeps its current volume.

Although the present invention has been specifically described on the basis of the preferred embodiment including the preferred method, the invention is not to be construed as being limited thereto. Various changes or modifications may be made to the embodiment including the method without departing from the scope and spirit of the invention.

What is claimed is:

1. An electronic apparatus for implementing a wake mode, the electronic apparatus comprising an input unit, a volume control unit, a timer, and a center control unit connected with the input unit and the timer, wherein:

the center control unit controls the electronic apparatus to enter the wake mode when a tracked system time of the timer reaches a predetermined waken time, and controls the volume control unit to increase a current volume when no operational input is received by the input unit for every predetermined time interval, and keeps the current volume when the current volume is equal to or greater than an initial volume; and the center control unit further controls the volume control unit to restore the initial volume when an operational input is received by the input unit and the "received operational input" is not a command for power off after the electronic apparatus enters the wake mode.

2. A method for implementing a wake mode on an electronic apparatus, the method comprising the steps of:

tracking a system time of the electronic apparatus;

entering the wake mode when the tracked system time equals a predetermined waken time;

increasing a current volume for every predetermined time interval when an operation input is not received by an input unit;

restoring a predetermined initial volume when an operational input is received by the input unit and the "received operational input" is not a command for power off after the electronic apparatus enters the wake mode; and keeping the current volume when the current volume is equal to or greater than the predetermined initial volume.

3. A method for implementing a wake mode on an electronic apparatus, the method comprising the steps of:

starting the wake mode when a system time of the electronic apparatus equals to a predetermined waken time;

increasing an output parameter value for every predetermined time interval after the staffing step when an operation input is not received by an input unit;

repeating increasing step based on elapsed time and the playing parameter value;

restoring a predetermined initial output parameter when an operational input is received by an input unit and the "received operational input" is not a command for power off after the electronic apparatus enters the wake mode; and keeping a current output parameter after the output parameter reaches the predetermined initial output parameter.

* * * * *